United States Patent
Bledin

(12) United States Patent  (10) Patent No.: US 6,337,549 B1
Bledin  (45) Date of Patent: Jan. 8, 2002

(54) CAPACITIVE ANTI FINGER TRAP PROXIMITY SENSOR

(76) Inventor: Anthony Gerald Bledin, 1921 Smokey Ridge Ave., Thousand Oaks, CA (US) 91362

( * ) Notice: Subject to any disclaimer, the term of this patent is extended or adjusted under 35 U.S.C. 154(b) by 0 days.

(21) Appl. No.: 09/571,871

(22) Filed: May 12, 2000

(51) Int. Cl.$^7$ .................................................. G05B 5/00
(52) U.S. Cl. ...................... 318/466; 318/479; 318/445; 318/449; 318/450; 318/469; 318/478
(58) Field of Search ................................. 318/466, 479, 318/445, 449, 450, 469, 478; 49/28

(56) References Cited

U.S. PATENT DOCUMENTS

| | | | |
|---|---|---|---|
| 4,369,344 A | * | 1/1983 | Diamond |
| 4,452,113 A | | 6/1984 | Pearl |
| 4,785,143 A | * | 11/1988 | Miller |
| 5,459,962 A | | 10/1995 | Bonne et al. |
| 5,621,290 A | | 4/1997 | Heller et al. |
| 5,754,017 A | | 5/1998 | Tsug et al. |
| 5,912,625 A | * | 6/1999 | Scofield |
| 5,932,931 A | | 8/1999 | Tanaka et al. |
| 5,966,071 A | | 10/1999 | Tsuge et al. |
| 6,032,415 A | * | 3/2000 | Tajima ........................ 318/466 |
| 6,114,820 A | * | 9/2000 | Nishigaya ................... 318/466 |

FOREIGN PATENT DOCUMENTS

| | | |
|---|---|---|
| DE | 31 37 351 | 9/1981 |
| DE | 32 06 466 | 2/1982 |
| DE | 33 05 464 | 2/1983 |
| DE | 34 11 198 | 3/1984 |
| DE | 34 18 589 | 5/1984 |
| DE | 35 13 051 | 4/1985 |
| DE | 35 27 405 | 7/1985 |
| DE | 37 06 450 | 2/1987 |
| DE | 37 17 771 | 5/1987 |
| DE | 40 04 353 | 2/1990 |
| DE | 40 13 624 | 4/1990 |
| DE | 40 42 496 | 4/1990 |
| DE | 40 36 465 | 11/1990 |
| DE | 41 18 219 | 6/1991 |
| DE | 42 01 019 | 1/1992 |
| DE | 42 15 744 | 5/1992 |
| DE | 43 20 548 | 6/1993 |
| DE | 44 16 803 | 5/1994 |
| DE | 44 27 537 | 8/1994 |
| DE | 44 34 334 | 9/1994 |
| DE | 195 35 796 | 9/1995 |
| DE | 296 16 654 | 9/1996 |
| DE | 197 24 952 | 6/1997 |
| DE | 297 10 499 | 6/1997 |
| DE | 197 48 076 | 10/1997 |
| DE | 197 50 711 | 11/1997 |
| DE | 198 03 305 | 1/1998 |
| DE | 198 18 650 | 4/1998 |
| DE | 198 34 531 | 7/1998 |
| EP | 0 666 956 | 4/1981 |
| EP | 0 619 413 | 12/1982 |
| EP | 0 026 719 | 6/1984 |
| EP | 0 334 028 | 4/1991 |
| EP | 0 585 024 | 6/1993 |
| EP | 0 556 711 | 12/1995 |

(List continued on next page.)

*Primary Examiner*—Karen Masih
(74) *Attorney, Agent, or Firm*—Stephen B. Salai, Esq.; Brian B. Shaw, Esq.; Harter, Secrest & Emery LLP

(57) ABSTRACT

The present invention relates to a trapping protector capable of detecting the presence of an object in a sensing region when connected with a device for creating input signals and evaluating output signals. Said trapping protector comprises a body portion, at least one ground electrode, at least one sensor electrode arranged spaced apart from said ground electrode and embedded in said body portion, and a zone of reduced rigidity between said at least one ground electrode and said at least one sensor electrode. Said zone reduces the force required for triggering said trapping protector.

23 Claims, 5 Drawing Sheets

| | U.S. PATENT DOCUMENTS | |
|---|---|---|
| EP | 0 560 047 | 5/1996 |
| EP | 0 803 628 | 10/1997 |
| EP | 0 845 570 | 6/1998 |
| EP | 0 856 425 | 8/1998 |
| EP | 0 869 250 | 10/1998 |
| EP | 0 776 406 | 11/1998 |
| EP | 0 776 407 | 11/1998 |
| EP | 0 823 956 | 2/1999 |
| GB | 84 15 225 | 10/1985 |
| GB | 94 07 216 | 4/1994 |
| WO | WO 86/05836 | 10/1986 |
| WO | WO 86/05837 | 10/1986 |
| WO | WO 89/08952 | 9/1989 |
| WO | WO 96/41062 | * 12/1996 |
| WO | WO 99/09570 | * 2/1999 |
| WO | WO 99/27219 | * 6/1999 |
| WO | WO 99/46469 | * 9/1999 |

* cited by examiner

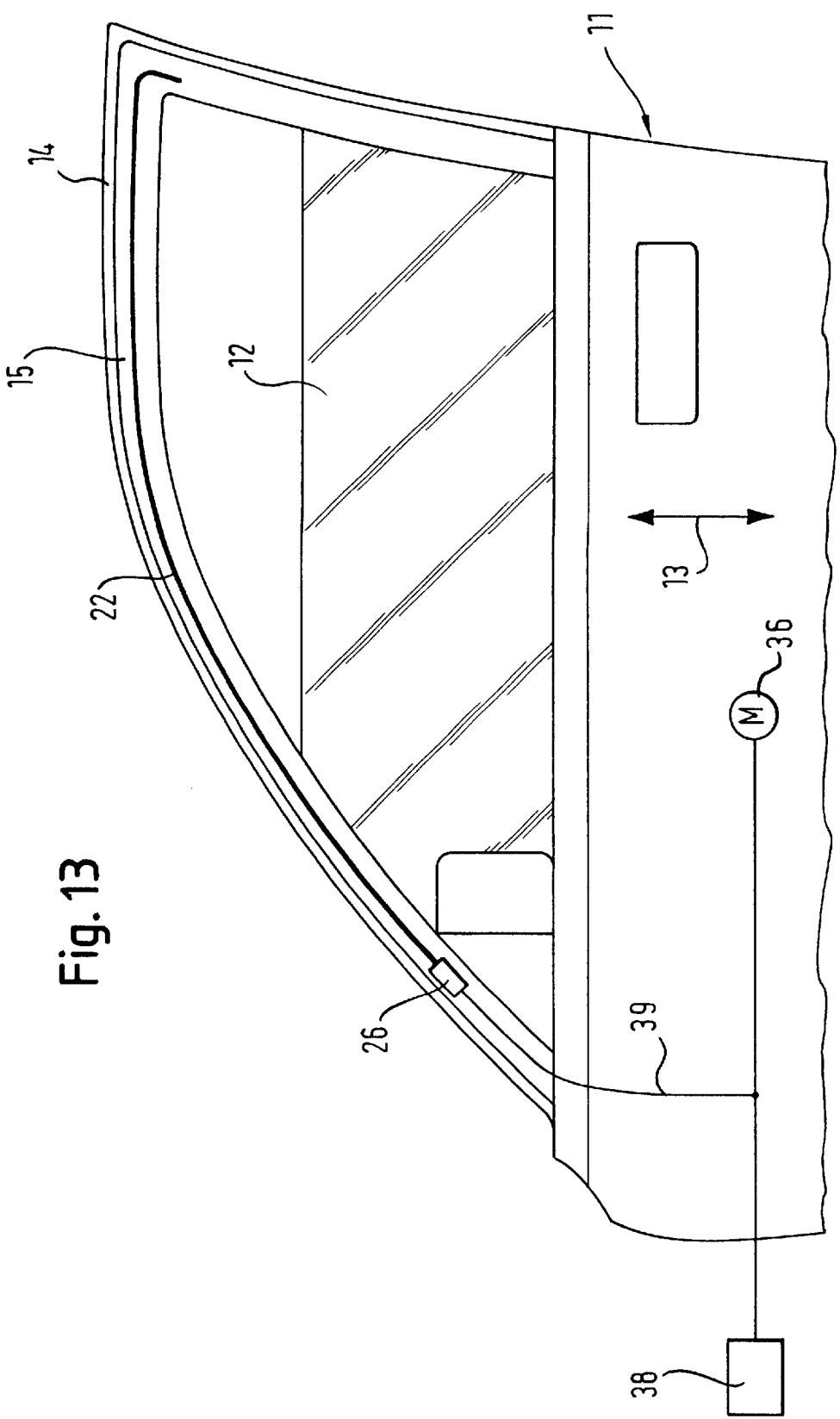

CAPACITIVE ANTI FINGER TRAP PROXIMITY SENSOR

BACKGROUND OF THE INVENTION

1. Field of the Invention

The present invention relates to a trapping protector for detecting the presence of an object in a sensing region. Said trapping protector comprises a body portion, at least one ground electrode and at least one sensor electrode which is arranged spaced apart from said ground electrode and embedded in said body portion. Additionally, the present invention relates to a system for controlling a power-driven window, comprising said trapping protector and a device for creating input signals to be applied to said sensor electrode and for receiving output signals from said sensor electrode.

2. Description of Related Art

The number of vehicles equipped with a power-driven window or sunroof is increasing, which utilizes the driving force of a motor whereby a light touch to an operating switch permits easy opening and closing of the window or sunroof. However, there exists the danger that foreign matter or a body part may be caught between the upper edge of the window and the window frame upon closing, thus leading to injuries.

National Highway Traffic Safety Administration Standard 118 contains regulations to assure safe operation of power windows.

Several approaches have been made in order to avoid such injuries. U.S. Pat. No. 5,459,962 discloses a trapping protector comprising two mutually spaced apart electrical conductors initiating a switching process of a drive unit when brought in contact. U.S. Pat. Nos. 5,754,017, 5,932,931 and 6,966,071 teach a power-driven window comprising a load detecting means for detecting the drive load of the motor driving the window. Said trapping protectors require physical contact and cause significant squeezing of a body part caught between the upper edge of the window and the window frame. Amended Standard 118 states that the maximum force allowable during closure is to be less than 100 Newton onto a solid cylinder having a diameter of between four and 200 millimeters.

There have been proposed trapping protectors which do not require physical contact and, accordingly, do not cause squeezing. U.S. Pat. Nos. 4,453,112 and 5,621,290, the disclosure of which is incorporated by reference, teach capacitive sensors. Arranged on a window frame is at least one sensor electrode to which an alternating current is applied. As soon as an electrically conductive medium such as a human body part is near said sensor electrode the capacity between said sensor electrode and a ground electrode changes. The change in capacity changes the frequency of an output signal of the sensor electrode. Said change is compared to a reference level, and the motor for the window is stopped or reversed if the change exceeds the threshold. Said capacitive sensors can only detect dielectric materials. Wood, plastic or any other non-conductive material cannot be detected as they do not cause a change of capacity.

SUMMARY OF THE INVENTION

It is therefore an object of the invention to provide a trapping protector which is capable of detecting electrically conductive objects without physical contact with said objects and at the same time capable of detecting objects of non-conductive material.

It is a further object of the invention to provide a trapping protector capable of detecting objects of electrically non-conductive material with only minimal squeezing of said objects.

It is another object of the invention to provide a system for controlling a power-driven window which avoids injuries during closure of said window.

The present invention provides a trapping protector wherein the sensor electrode and the ground electrode are arranged spaced apart from each other with a zone of reduced rigidity between said two electrodes. Said zone or "soft spot" allows easy displacement of the electrodes with respect to each other.

The present invention further provides a system for controlling a power-driven window comprising a trapping protector as set forth above and a device for creating input signals to be applied to said sensor electrode and for receiving output signals from said sensor electrode.

Said output signals are then processed in order to detect any obstacle between the window and a window frame.

Both the trapping protection and the system in accordance with the present invention may be used especially for vehicle doors. The window frame may either be attached to the door or to the vehicle body.

Any object of dielectric material entering the sensing region will be detected without physical contact due to a change in capacity between said sensor electrode and said ground electrode. The capacity will rise upon presence of said object in the sensing region. Upon detection, a motor driving the window will be stopped or reversed. Any object of non-conductive material will not cause a change of capacity and, accordingly, the motor will not stop. Therefore, the object will be forced in contact with the body portion of the trapping protector, causing displacement of the two electrodes with respect to each other. Said displacement can be effected with minimal force and minimal squeezing due to the soft spot arranged between said electrodes. Displacement of the electrodes with respect to each other leads to a change in capacity which is detected and causes the motor to stop or reverse.

The soft spot may be configured as an air gap or hollow chamber or as material of higher resilience than the body portion, preferably sponge rubber. Both an air gap and a sponge rubber may be coextruded together with the body portion, allowing for easy and simple manufacturing. The sensor electrode may be embedded in the body portion close to said soft spot.

In a first embodiment, the ground electrode is arranged separately from the body portion, preferably as part of a window frame. The body portion may then be attached to the ground electrode. Preferably, the body portion is then configured as a sealing profile for a power window. As only the sensor electrode is embedded in the body portion, said body portion may feature a small cross-section and will not obstruct viewing out of the window. Alternatively, the ground electrode may be embedded in the body portion allowing for easier assembly.

The size and orientation of the sensing region may be changed by suitable shaping and/or arranging of the sensor electrode and the ground electrode with respect to each other, by changing the number of the sensor electrodes and/or of the ground electrodes or by charging the sensor electrode and/or the ground electrode to different potentials.

The body portion of the trapping protector is preferably at least partially made of an electrically non-conductive material in order to insulate the sensor electrode with respect to the ground electrode. However, the body portion may comprise one or several electrically conductive regions. Said regions surround the sensor electrode and/or the ground electrode, thus enlarging their cross-section and changing their shape. The enlarged cross-section provides a higher sensitivity, while the change in electrode shape allows the change in size and orientation of the sensing region. The electrically conductive regions may be provided in a accordance with the pending U.S. application Ser. No. 09/315, 795, corresponding to WO 98/25780, the disclosure of which is incorporated by reference.

Several methods may be used in order to detect an object in the sensing region. It is currently preferred to apply random burst signals to the sensor electrode charging it to a fixed potential. Next, the charge of the sensor electrode is transferred to a charge detector comprising a known capacitor. The capacitance of the sensor electrode can then be readily ascertained. The value obtained is compared to a given reference level, and the motor for the power-driven window is stopped or reversed depending on the results of the comparison. Sampling time and sampling period as well as the frequency of the applied signals can be varied. However, it is also possible to use a method as described in U.S. Pat. No. 4,453,112 or U.S. Pat. No. 5,621,290.

BRIEF DESCRIPTION OF THE DRAWINGS

Additional objects and advantages of the present invention will be more readily apparent from the following detailed description of preferred embodiments thereof when taken together with the accompanying drawings in which.

FIG. 13 is an enlarged schematic side view of a vehicle door featuring a further embodiment of a system in accordance with the invention.

DETAILED DESCRIPTION OF PREFERRED EMBODIMENTS

Figure 1:
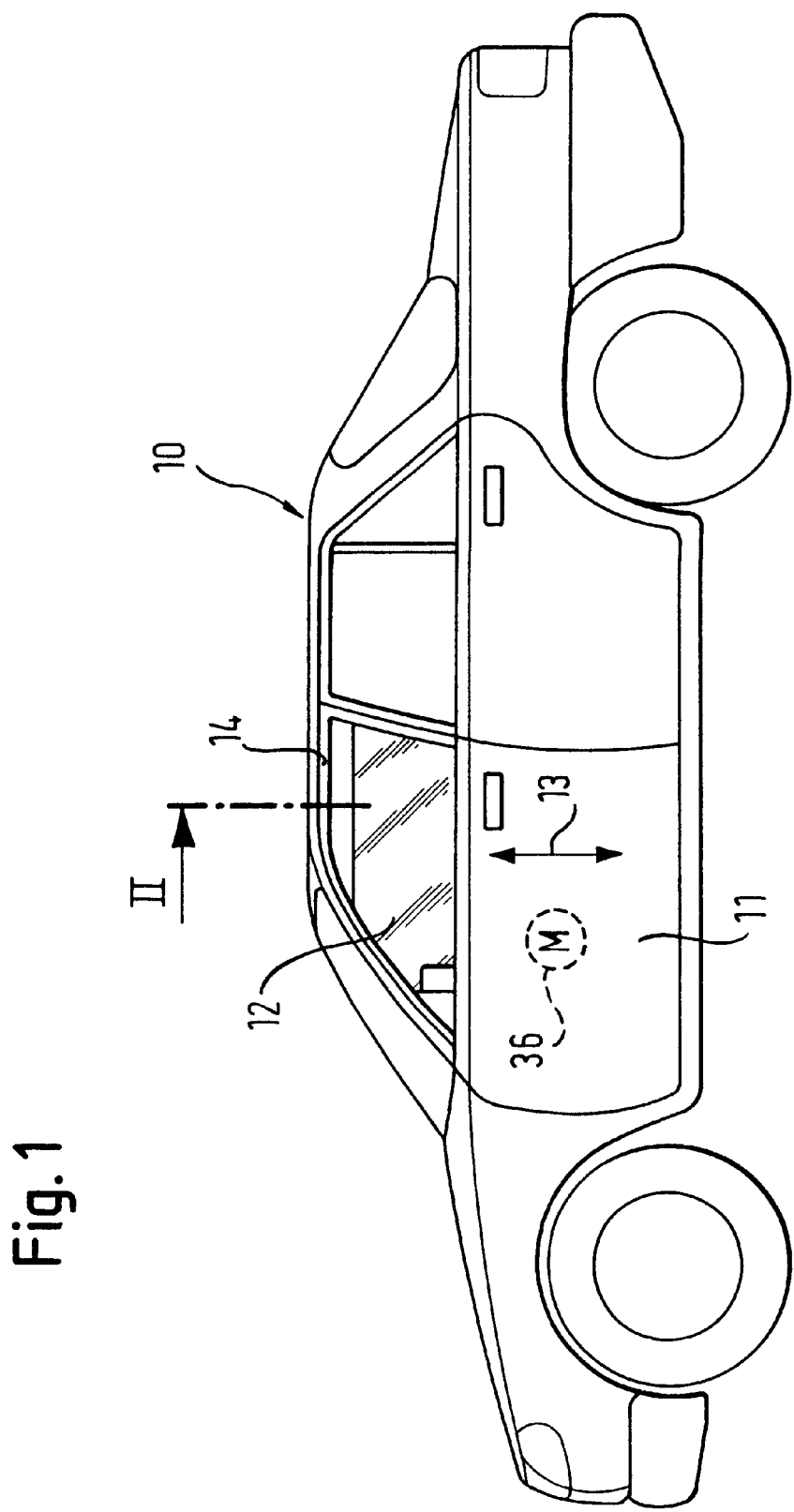
FIG. 1 is a diagrammatic side elevation of a motor vehicle.

FIG. 1 shows a motor vehicle 10 having a front door 11 with a power-driven window 12 which is shown cross-hatched for clarity. The power-driven window 12 is raised and lowered in direction 13 by means of a suitable motor 36, usually an electric motor under control by switches positioned within the vehicle for use by the driver and/or passengers. All or some of the other side windows in the vehicle as well as a sun roof may be power-driven. Arranged around the opening of the window 12 is a window frame 14 which may be attached to the door 11 or alternatively to the body of the vehicle 10.

Figure 2:
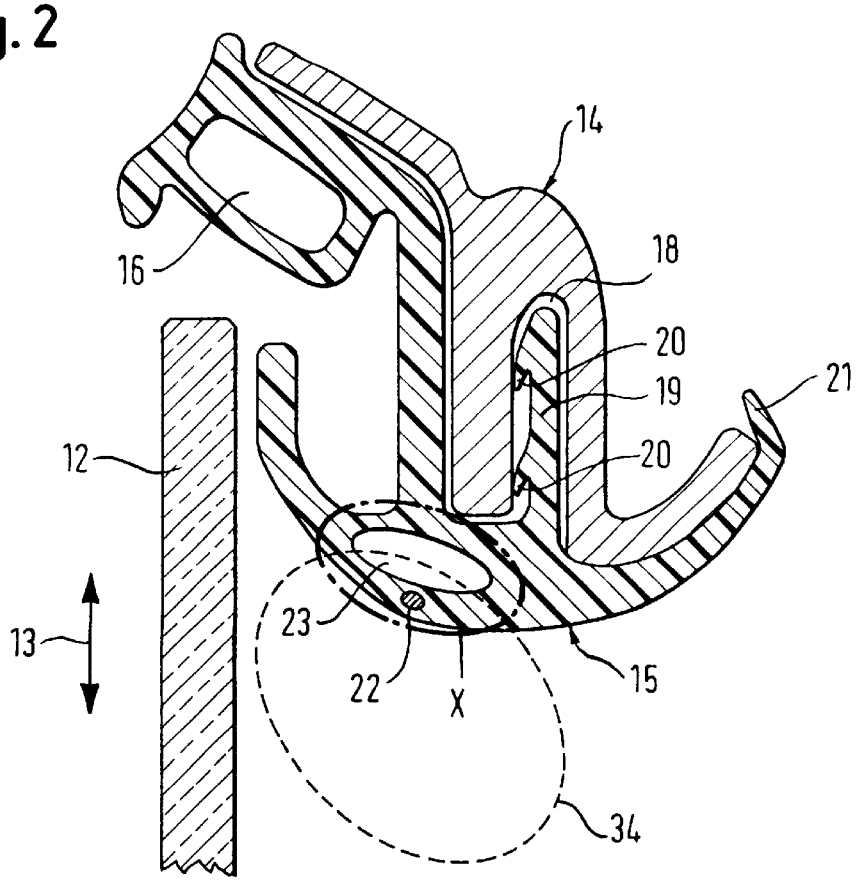
FIG. 2 is a cross-sectional view along line 11 in FIG. 1.

FIG. 2 shows a cross-section through the window frame 14 along line 11 in FIG. 1 showing the trapping protector of the present invention more in detail. The window frame 14 is made of an electrically conductive material such as steel. Attached to the window frame 14 is a sealing profile 15 made of rubber or any other suitable non-conductive material. Attachment of the sealing profile 15 to the window frame 14 is achieved by a flange 19 of the sealing profile 15 protruding in a channel 18 of the window frame 14. To enhance the attachment the flange 19 is provided with lips 20. The sealing profile 15 serves as body portion for the trapping protector of the present invention.

Additionally, the sealing profile 15 is provided with a hollow chamber 16 and a lip 17 for abutment against the window 12. The sealing profile 15 further features an additional lip 20 covering the window frame 14.

Located near the window 12 is provided a sensor electrode 22 which is embedded in the sealing profile 15. The window frame 14 is configured as ground electrode. Arranged between the sensor electrode 22 and the window frame 14 is an air gap or hollow chamber 23. Said hollow chamber 23 reduces the stiffness of the sealing profile 15. An electrical signal which will be described more in detail below is applied to the sensor electrode 22 and charges it. If an object of dielectric material such as a body part like a hand comes near the sensor electrode 22 the motor 36 for driving the window 12 is stopped or reversed. Detection of such an object occurs in a sensing region 34 schematically shown with dashed lines.

An object of electrically non-conductive material, e.g. plastic, cannot be detected when entering the sensing region 34. However, if the motor 36 driving the window 12 is actuated, said object will be forced in contact with the sealing profile 15, finally deforming the sealing profile 15 and displacing the sensor electrode 22 with respect to the window frame 14. Said displacement triggers the trapping protector of the present invention and stops or reverses the motor 36. The force required for deformation and displacement is significantly reduced due to the hollow chamber 23 or acting as soft spot and providing a zone of reduced rigidity.

Figure 3:
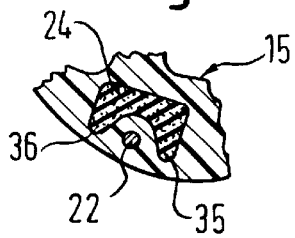
FIG. 3 to FIG. 10 are different embodiments of the detail X of FIG. 2.

Alternative embodiments of the trapping protector in accordance with the present invention are shown in FIG. 3 to FIG. 10. In FIG. 3 the hollow chamber 23 is replaced by a sponge material 24 featuring a higher resilience than the sealing profile 15. The sponge material 24 is approximately U-shaped in cross-section with the sensor electrode 22 embedded between two legs 35, 36 of the of the sponge material 24. The window frame 14 is used as ground electrode.

Figure 4:
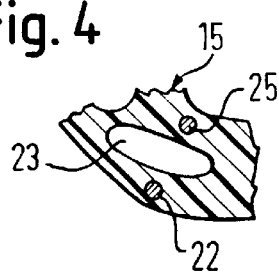
Figure 5:
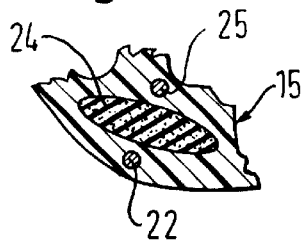

FIG. 4 shows a different embodiment with both a ground electrode 25 and a sensor electrode 22 embedded in the sealing profile 15. The electrodes 22, 25 are separated by a hollow chamber 23. The embodiments of FIG. 5 and FIG. 6 feature a sensor electrode 22 and a ground electrode 25, too. Here, the electrodes 22, 25 are separated by a sponge material 24 either in a cross-section similar to the shape of the hollow chamber 23 or in double U-shape. In the latter case, the electrodes 22, 25 are embedded between the respective legs 35, 36 of the sponge material.

It should be noted that the soft spot in form of the air gap or hollow chamber 23 or the sponge material 24 is always arranged between the electrodes 22, 25 or the sensor electrode 22 and the window frame 14 serving as ground electrode. If both electrodes 22, 25 are embedded in the sealing profile 15 the ground electrode 25 is located spaced apart from the window frame 14 near the outer surface of the sealing profile. The sensor electrode 22 is then arranged between the soft spot and the window frame 14.

Figure 6:
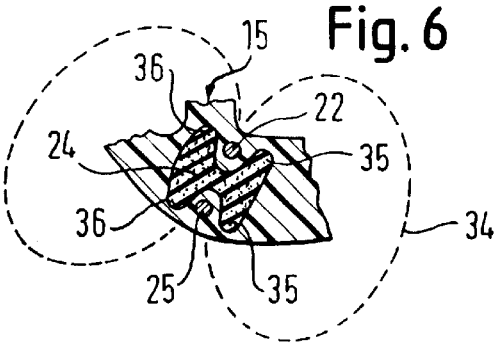
Figure 7:
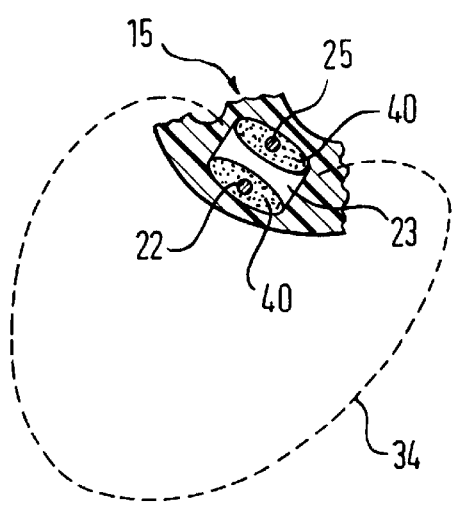

The positions of the sensor electrode 22 and the ground electrode 25 may be exchanged as shown in FIG. 7. Said change allows for a change in the size and orientation of the sensing region 34 which is limited by the ground electrode 25. Compared to FIG. 2, the embodiment of FIG. 6 provides a sensing region 34 extending inward and outward but hardly downward.

Further embodiments are shown in FIGS. 7 to 10. FIG. 7 shows a body portion 15 provided with two electrically conductive regions 40 surrounding the sensor electrode 22 and the ground electrode 25. Said regions 40 are separated by an air gap or hollow chamber 23. The regions 40 enlarge the cross-section of electrodes 22, 25 and change their shape. Accordingly, the sensitivity of the trapping protector is higher, while the sensing region 34 can be changed in size and orientation.

Figure 8:
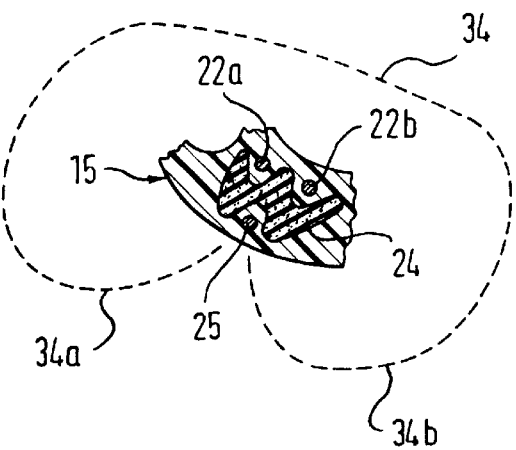

FIG. 8 shows the use of two sensor electrodes 22a, 22b together with one common ground electrode 25. The ground electrode 25 effectively limits the sensing region 34. Accordingly, the sensing region 34 extends inwardly and outwardly as indicated with 34a, 34b, but hardly downward in the middle near the ground electrode 25.

Figure 9:
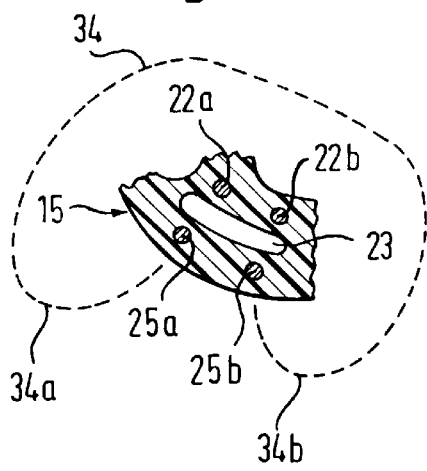

It is also possible to use two sensor electrodes 22a, 22b together with two ground electrodes 25a, 25b as shown in FIG. 9. Said embodiment allows for effective separation of the two regions 34a, 34b of the sensing region 34.

Figure 10:
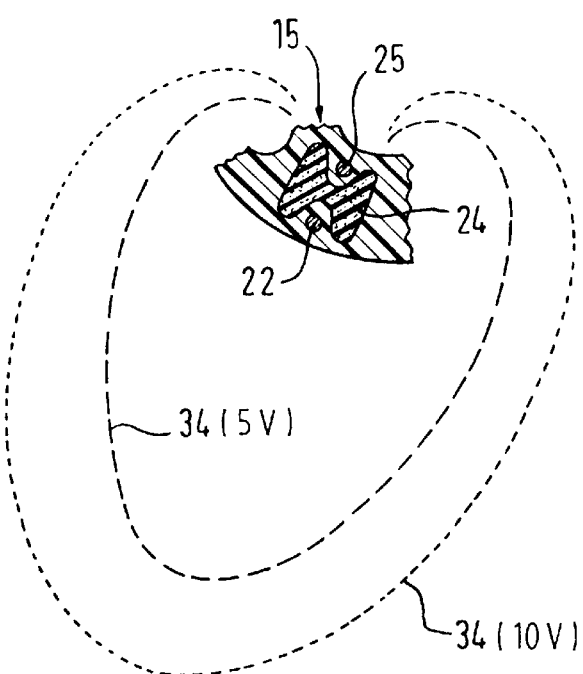

FIG. 10 shows the change of the sensing region 34 depending on the charge applied to the sensor electrode 22. The first sensing region shown in dashed line indicates a charge of 5 Volt. The outer, dotted line indicates the sensing region with a charge of 10 Volt.

It goes without saying that the different approaches shown in FIGS. 7 to 10 my be combined. Therefore, the size and orientation of the sensing region 34 may be changed depending on the requirements.

Figure 11:
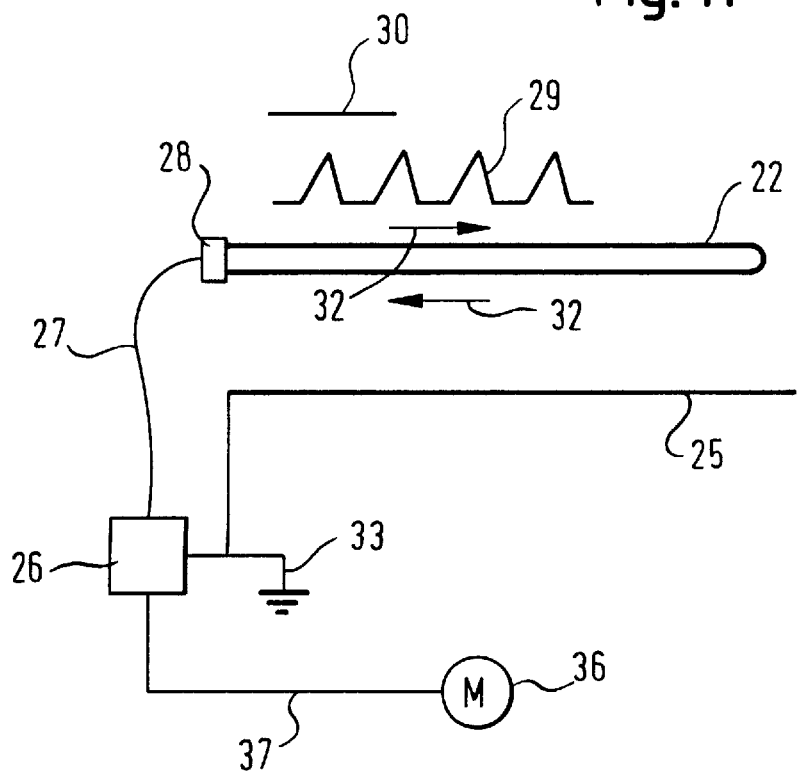
FIG. 11 is a schematic view of a first embodiment of a system for controlling a power-driven window.

FIG. 11 shows a schematic view of a first arrangement a system for controlling a power-driven window 12. Said system comprises a sensor electrode 22 and a ground electrode 25 and a control 26. The control 26 is capable of creating input signals to be applied to said sensor electrode 22 and for receiving output signals from said sensor electrode 22. Additionally, it performs a check of the output signals to determine whether an object is near the sensor electrode 22 or trapped between the window 12 and the window frame 14.

The sensor electrode 22 forms a loop and is with its both ends connected to the control 26 via an umbilical cable 27 and a connector 28. The ground electrode 25 is arranged in proximity of the sensor electrode 22. Although the two electrodes 22, 25 are shown as extending parallel to each other, any other suitable arrangement may be chosen as long as the distance between the electrodes 22, 25 does not exceed a certain limit.

The sensor electrode 22 is charged with a random burst signal schematically shown at 29. Sampling time and sampling period as well as frequency of the signal 29 can be varied in accordance with the requirements. Preferably, the frequency is adapted to the length of the sensor electrode 22 so that the overall length of the sensor electrode 22 is much smaller than the wave length of signal 29. Said relationship will provide for almost constant sensitivity regardless of changes in the length of the sensor electrode 22.

The signal 29 charges the sensor electrode 22, The amount of charge stored depends on the capacity between the sensor electrode 22 and the ground electrode 25. The charge is then transferred to a capacitor with known capacity (not shown) in the control 26. Therefore, the capacitance of the sensor electrode 22 can be readily ascertained and compared to a given reference level. The motor 36 driving the window 12 is stopped or reversed depending on the result of the comparison. Connection between the control 26 and the motor 36 is achieved by a suitable cable 37. The charge transferred to the known capacitor is the output signal of the trapping protector.

The capacitance of the sensor electrode 22 changes if an object of dielectric material is present in the sensing region 34. Therefore, presence of said object can be detected. An object of a non-conductive material will displace the sensor electrode 22 with respect to the ground electrode 25 during closure and, accordingly, cause a change in capacity.

The sensor electrode 22 is monitored in order to ensure proper operation of the trapping protector. A low intensity dc-signal schematically shown as 30 is applied to one end of the sensor electrode 22 and travels along said electrode 22 as shown with arrows 32. If the sensor electrode 22 is undamaged, the signal 30 will register at the other end of the sensor electrode 22. If for some reason the sensor electrode 22 is cut, the signal 30 does not arrive at said other end. Lack of the signal 30 triggers a warning indicating that the trapping protector may not be operational. It should be noted, however, that the trapping protector is fully operational in the region between contact 28 and the position of the cut.

Figure 12:
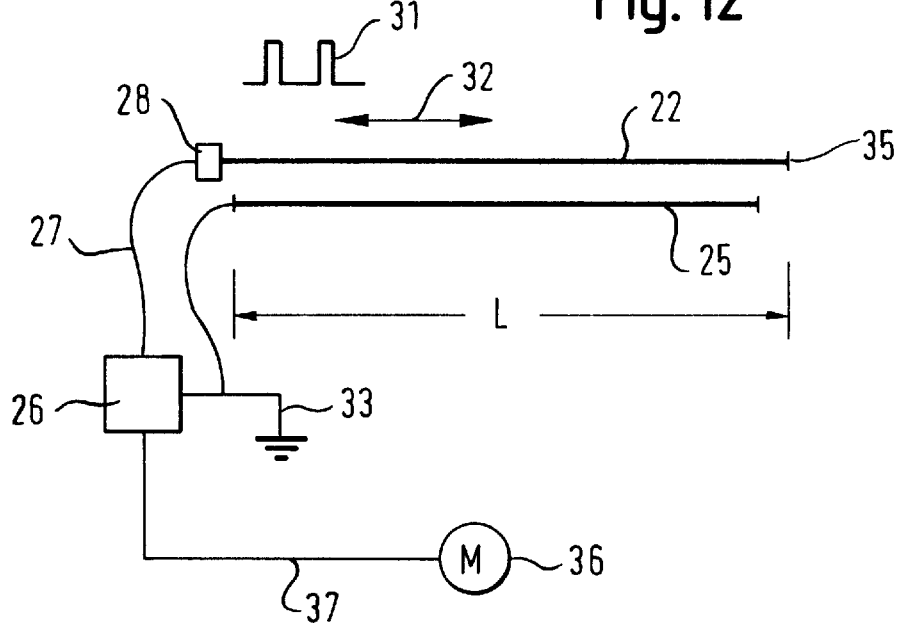
FIG. 12 is a schematic view of a second embodiment of a system for controlling a power-driven window.

The second embodiment of the system for controlling a power-driven window 12 shown in FIG. 12 uses a sensor electrode 22 which is at one end connected to a control 26 while its other end 35 is free. Charging of the sensor electrode 22 and evaluating the output signal is effected as described above in connection with FIG. 7. The sensor electrode 22 is monitored by applying a known signal schematically shown at 31. The signal 31 is preferably applied for a very short period of time, e.g. as a ping. Next, the signal 31 travels along the sensor electrode 22, is reflected at its free end 35 and then travels back to connector 28. Signal travel is indicated with arrow 32. The length of the sensor electrode 22 can then be calculated on basis of the runtime of signal 31.

FIGS. 11 and 12 disclose two ways of assuring integrity of the sensor electrode 22 and therefore provide a fail-safe mechanism for the trapping protector in accordance with the invention. A third way consists in checking the capacity of the sensor electrode 22 or the ground electrode 25. If one or both of said electrodes 22, 25 is cut, the capacity will decrease. Said decrease in capacity can be measured and trigger a warning indicating that the trapping protector may not be fully operational.

In both embodiments the control 26 is shown as connected to the ground electrode 25 and grounded itself at 33. It should be noted that connecting of the control 26 to the ground electrode 25 and grounding the control 26 is not necessarily required for proper function of the trapping protector. As long as the ground potential of the known capacitor in the control 26 and the potential of the ground electrode 25 remain constant, preferably at the same level, the ground electrode 25 need not be connected to the control 26.

However, the potential of the ground electrode 25 may change. It is well known that vehicles may be charged during use. Said charge is usually transferred to the driver when opening or closing the door. Said change in potential can affect the amount of charge that can be stored on the sensor electrode 22 and cause malfunctions of the trapping protector. It is therefore preferred to connect the control 26 and the ground electrode 25. Grounding is effected to avoid unnecessary and possibly detrimental buildup of potential. The ground electrode 25 may, however, be connected to the control 26 without grounding for charging to a given potential in order to shape the sensing region 34.

FIG. 13 is an enlarged schematic side view of a vehicle door 11 comprising a window frame 40 provided with a sealing profile 15. Embedded in the sealing profile 15 is a sensor electrode 22. The sensor electrode 22 is connected to a control 26 which is embedded in the sealing profile 15, too. Embedding both the control 26 and the sensor electrode 22 in the sealing profile 15 allows for easy assembly of the vehicle door 11.

The control 26 is provided with a single wire 39 connected to motor 36 for raising and lowering the window glass 12. Wire 39 is also connected to a battery 38 supplying the required power for the control 26 and the motor 36. Accordingly, the wire 39 supplies the required power to the control 26 and transports signals from the control 26 to the motor 36 and possibly other electric or electronic components which are not shown in detail. Therefore, only wire 39 protrudes from the sealing profile 11 so that assembly of the vehicle door 15 is further simplified.

Depending on the construction of the sealing profile 15 the control 26, the sensor electrode 22 and wire 39 and wire 39 are either embedded in the sealing profile 15 or attached thereto. If the sealing profile 15 comprises a rigid outer frame which is backed by extruded material, the control 26, the sensor electrode 22 and the wire 39 may be attached to the rigid outer frame and then covered with the remaining parts of the sealing profile 15.

The present invention provides a trapping protector as well as a system for controlling a power-driven window 12 which allow detection of electrically conductive objects without physical contact. Detection of objects of electrically non-conductive material is achieved with minimal squeezing due to the soft spot in form of the hollow chamber 23 or the soft material 24 between the sensor electrode 22 and the ground electrode 25.

What is claimed is:

1. A trapping protector capable of detecting the presence of an object in a sensing region when connected with a device for creating input signals and evaluating output signals, comprising:
   a body portion of a non conducting material,
   at least one ground electrode,
   at least one sensor electrode arranged spaced apart from said ground electrode and embedded in said body portion, said ground and sensor electrodes providing a capacitor means for sensing the presence of an object of a dielectric material in said sensing region, and
   said body portion of a non conductive material being provided with a zone of reduced rigidity between said at least one ground electrode and said at least one sensor electrode.

2. The trapping protector of claim 1 wherein said zone of reduced rigidity is in the form of an air gap provided in said body portion.

3. The trapping protector of claim 1 wherein said zone of reduced rigidity is in the form of a material of higher resilience than said body portion.

4. The trapping protector of claim 3 wherein said material of higher resilience is made of sponge rubber.

5. The trapping protector of claim 1 wherein said ground electrode is constructed separately from said body portion, said body portion being attached to said ground electrode.

6. The trapping protector of claim 5 wherein said ground electrode is a part of a window frame.

7. The trapping protector of claim 1 wherein said ground electrode is embedded in said body portion.

8. The trapping protector of claim 1 wherein said sensor electrode is in the form of a loop.

9. The trapping protector of claim 1 wherein said body portion is configured as a sealing profile for a power-driven window.

10. The trapping protector of claim 1 wherein said body portion is at least partially made of an electrically non-conductive material.

11. The trapping protector of claim 1 wherein said body portion comprises at least one electrically conductive region.

12. The trapping protector of claim 6 wherein said body portion is configured as a sealing profile for a power-driven window.

13. A trapping protestor as in claim 1 wherein said sensing region has a shape determined by the shape of at least one of said sensor electrode and said ground electrode.

14. A trapping sensor as in claim 1 wherein said sensing region has a shape determined by the relative arrangement of said sensor electrode and said ground electrode.

15. A trapping sensor as in claim 1 wherein said sensing region has a shape determined by the potential of at least one of said sensor electrode and ground electrode.

16. A system for controlling a power-driven window, including a capacitive trapping protector capable of detecting the presence of an object in a sensing region comprising:
   at least one body portion of a non conducting material;
   at least one ground electrode;
   at least one sensor electrode arranged spaced apart from said ground electrode and embedded in said body portion wherein said ground and sensor electrodes providing capacitor means for sensing the presence of an object in said sensing region;
   said body portion having a zone of reduced rigidity located between said at least one ground electrode and said at least one sensor electrode; and
   a device for creating input signals to be applied to said sensor electrode and for receiving output signals from said sensor electrode, wherein said output signals change depending upon the presence of a dielectric object in said sensing region and upon a change in the mutual position of said sensor electrode and said ground electrode, said device initiating a switching process of a drive unit depending on a change in said output signals.

17. The system according to claim 16 wherein said sensor electrode is in the form a of loop and both ends of said sensor electrode are connected to said device.

18. The system according to claim 16 wherein said device is capable of emitting a low-intensity dc signal.

19. The system according to claim 18 wherein said device is electrically connected to said ground electrode.

20. The system according to claim 18 wherein said device is electrically connected to said ground electrode.

21. A trapping protestor as in claim 16 wherein said sensing region has a shape determined by the shape of at least one of said sensor electrode and said ground electrode.

22. A trapping sensor as in claim 16 wherein said sensing region has a shape determined by the relative arrangement of said sensor electrode and said ground electrode.

23. A trapping sensor as in claim 16 wherein said sensing region has a shape determined by the potential of at least one of said sensor electrode and ground electrode.

* * * * *

(12) EX PARTE REEXAMINATION CERTIFICATE (7315th)
United States Patent
Bledin

(10) Number: US 6,337,549 C1
(45) Certificate Issued: Jan. 12, 2010

(54) CAPACITIVE ANTI FINGER TRAP PROXIMITY SENSOR

(76) Inventor: Anthony Gerald Bledin, 1921 Smokey Ridge Ave., Thousand Oaks, CA (US) 91362

Reexamination Request:
No. 90/009,259, Aug. 21, 2008

Reexamination Certificate for:
Patent No.: 6,337,549
Issued: Jan. 8, 2002
Appl. No.: 09/571,871
Filed: May 12, 2000

(51) Int. Cl.
*E05F 15/00* (2006.01)

(52) U.S. Cl. .......... 318/466; 318/468; 318/445; 318/450; 324/658; 324/663

(58) Field of Classification Search .......... None
See application file for complete search history.

(56) References Cited

U.S. PATENT DOCUMENTS 3,167,824 A * 2/1965 Berwanger .......... 49/482.1
5,165,201 A 11/1992 Mishama et al.
5,730,165 A 3/1998 Philipp
6,233,872 B1 5/2001 Glagow et al.
6,377,009 B1 4/2002 Philipp

FOREIGN PATENT DOCUMENTS

DE 196 02 744 A1 7/1997
FR 2 098 871 A5 3/1972

OTHER PUBLICATIONS

U.S. Appl. No. 60/152,605 filed, Sep. 8, 1999.*

* cited by examiner

*Primary Examiner*—Anjan K. Deb

(57) ABSTRACT

The present invention relates to a trapping protector capable of detecting the presence of an object in a sensing region when connected with a device for creating input signals and evaluating output signals. Said trapping protector comprises a body portion, at least one ground electrode, at least one sensor electrode arranged spaced apart from said ground electrode and embedded in said body portion, and a zone of reduced rigidity between said at least one ground electrode and said at least one sensor electrode. Said zone reduces the force required for triggering said trapping protector.

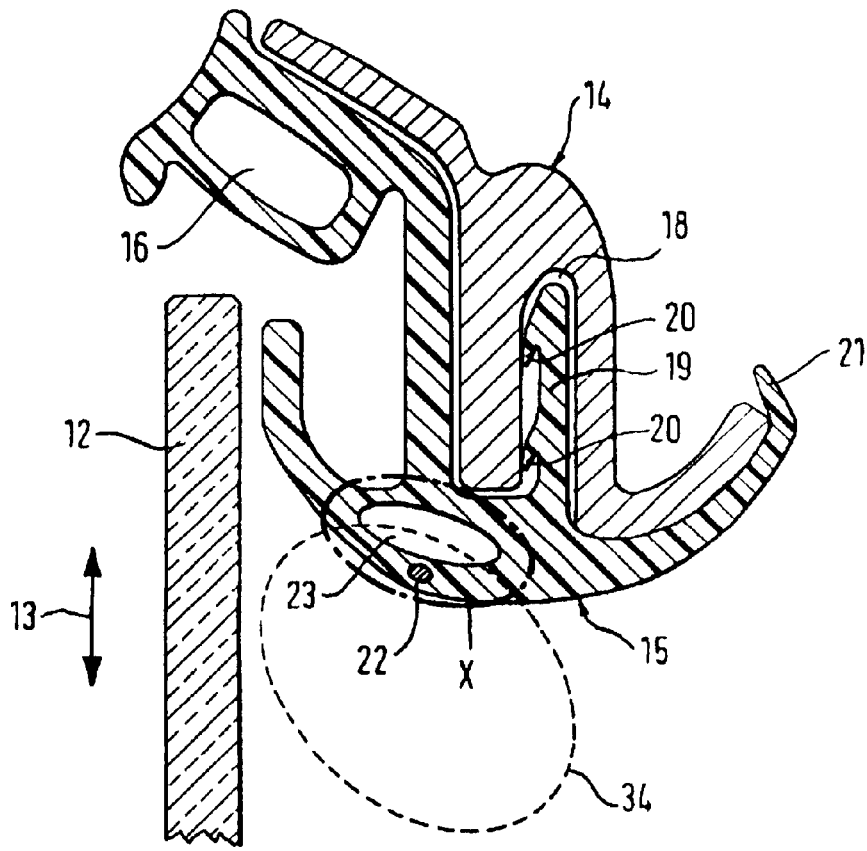

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–19 and 21–23 is confirmed.

Claim 20 is determined to be patentable as amended.

20. The system according to claim [18] *16* wherein said device is electrically connected to said ground electrode.

\* \* \* \* \*